United States Patent
Muto et al.

(10) Patent No.: US 9,425,029 B2
(45) Date of Patent: Aug. 23, 2016

(54) PROCESSING APPARATUS HAVING A FIRST SHIELD AND A SECOND SHIELD ARRANGED TO SANDWICH A SUBSTRATE

(71) Applicant: CANON ANELVA CORPORATION, Kawasaki-shi (JP)

(72) Inventors: Yoshihiro Muto, Kawasaki (JP); Ryuji Higashisaka, Kawasaki (JP); Satoshi Yamada, Kawasaki (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 14/597,523

(22) Filed: Jan. 15, 2015

(65) Prior Publication Data

US 2015/0235822 A1    Aug. 20, 2015

(30) Foreign Application Priority Data

Feb. 17, 2014   (JP) .................................. 2014-027821

(51) Int. Cl.
| | |
|---|---|
| *C23C 16/54* | (2006.01) |
| *C23C 14/50* | (2006.01) |
| *C23C 14/54* | (2006.01) |
| *C23C 14/34* | (2006.01) |
| *C23C 14/04* | (2006.01) |
| *H01J 37/34* | (2006.01) |
| *C23C 14/56* | (2006.01) |
| *H01J 37/32* | (2006.01) |
| *B05C 13/02* | (2006.01) |

(52) U.S. Cl.
CPC ........... *H01J 37/3441* (2013.01); *C23C 14/042* (2013.01); *C23C 14/34* (2013.01); *C23C 14/564* (2013.01); *H01J 37/32651* (2013.01); *H01J 37/3447* (2013.01); *B05C 13/02* (2013.01); *C23C 14/568* (2013.01); *C23C 16/54* (2013.01)

(58) Field of Classification Search
None
See application file for complete search history.

(56) References Cited

U.S. PATENT DOCUMENTS

| | | | | |
|---|---|---|---|---|
| 4,749,465 | A * | 6/1988 | Flint | ..................... C23C 14/568 204/192.12 |
| 4,911,810 | A * | 3/1990 | Lauro | ................... C23C 14/568 204/192.12 |
| 2006/0086321 | A1 * | 4/2006 | Brody | ................... C23C 14/042 118/720 |

FOREIGN PATENT DOCUMENTS

| | | |
|---|---|---|
| JP | 8-013143 A | 1/1996 |
| JP | 11-029150 A | 2/1999 |

* cited by examiner

*Primary Examiner* — Binu Thomas
(74) *Attorney, Agent, or Firm* — Buchanan Ingersoll & Rooney PC (57) ABSTRACT

A processing apparatus includes a supply source including a first supply source and a second supply source arranged to respectively face a first surface of a substrate and a second surface on an opposite side of the first surface. The supply source is configured to supply a material to apply a process to the substrate. A shield member includes a first shield provided around the first supply source and a second shield provided around the second supply source, the first shield and the second shield being arranged to sandwich the substrate. A moving device is configured to move the first shield and the second shield to set one of a close state in which the first shield and the second shield are close to each other and a separate state in which the first shield and the second shield are separate from each other.

12 Claims, 8 Drawing Sheets

PROCESSING APPARATUS HAVING A FIRST SHIELD AND A SECOND SHIELD ARRANGED TO SANDWICH A SUBSTRATE

BACKGROUND OF THE INVENTION

1. Field of the Invention

The present invention generally relates to a processing apparatus which processes a substrate and, more particularly, to a processing apparatus which processes two surfaces of a substrate.

2. Description of the Related Art

A processing apparatus which simultaneously deposits films on the two surfaces of a substrate such as a hard disk medium performs processes such as sputtering while sequentially conveying each substrate held on a substrate holder into a vacuum vessel, as disclosed in Japanese Patent Laid-Open Nos. 8-13143 and 11-29150. At this time, thin films originating from a process adhere to the inner wall of the vacuum vessel and units and the like arranged inside the vacuum vessel. As such a thin film increases in thickness to some extent, the film peels off from the adhesion position and becomes particles.

In general, in order to prevent thin films from adhering to the inner wall of a vacuum vessel and units and the like, in a processing apparatus, replaceable shields to which thin films are made to adhere are arranged in a vacuum vessel to suppress the generation of particles.

According to the related art, many (at least about 10) shields are combined and arranged in a vacuum vessel to prevent thin films from adhering to the inner wall of the vacuum vessel and units and the like. However, since such shields are components to be periodically replaced, the use of many shields will lead to more complicated maintenance and higher maintenance cost.

SUMMARY OF THE INVENTION

The present invention provides a processing apparatus advantageous in maintaining shield members provided in a vacuum vessel.

According to one aspect of the present invention, there is provided a processing apparatus including a vacuum vessel, a supply source including a first supply source and a second supply source arranged to respectively face a first surface of a substrate conveyed into the vacuum vessel and a second surface on an opposite side to the first surface and configured to supply a material to apply a process to the substrate, a shield member including a first shield provided around the first supply source and a second shield provided around the second supply source, the first shield and the second shield being arranged to sandwich the substrate, and a moving device configured to move the first shield and the second shield to set one of a close state in which the first shield and the second shield are close to each other and a separate state in which the first shield and the second shield are separate from each other, wherein the shield member forms process spaces between the first supply source and the substrate and between the second supply source and the substrate when the moving device moves the first shield and second shield to set the close state, and the process is applied to the first surface and the second surface in the process spaces.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
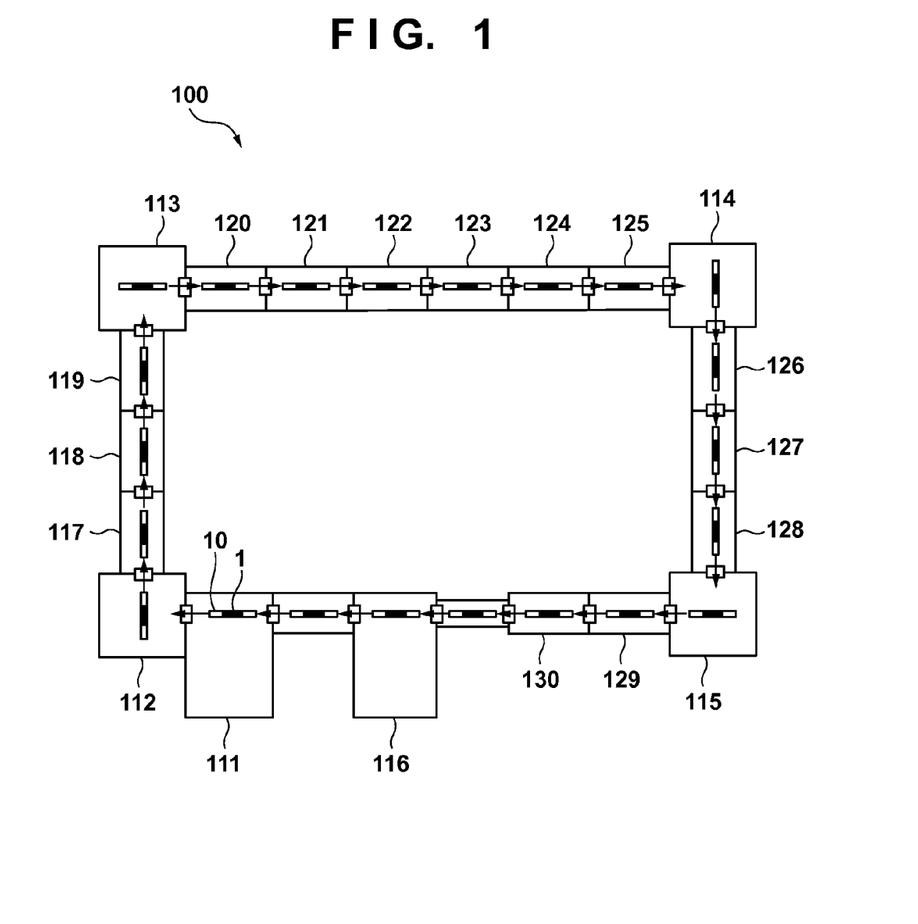
FIG. 1 is a schematic plan view showing the arrangement of a processing apparatus as one aspect of the present invention.

FIG. 1 is a schematic plan view showing the arrangement of a processing apparatus 100 as one aspect of the present invention. The processing apparatus 100 is an apparatus which processes a substrate such as a hard disk medium, and is formed as an inline processing apparatus in this embodiment. The inline scheme is a method of processing a substrate while conveying the substrate through a plurality of chambers coupled to each other. Referring to FIG. 1, a plurality of chambers 111 to 130 are coupled to each other in an endless shape so as to form a rectangular layout.

The chambers 111 to 130 include process chambers such as a sputter chamber, and form a thin film or a thin film with a multilayer structure on a substrate. A conveying device which conveys a substrate 1 held by a carrier 10 is arranged in each of the chambers 111 to 130. In the processing apparatus 100, the adjacent chambers are coupled to each other via a gate valve.

Of the chambers 111 to 130, the chamber 111 is a load lock chamber in which the substrate 1 is attached to the carrier 10, and the chamber 116 is an unload lock chamber in which the substrate 1 is detached from the carrier 10. In addition, the chambers 112, 113, 114, and 115 are chambers including direction changing devices, each of which changes the conveying direction of the carrier 10 (substrates 1) by 90°. At least one of the chambers 117 to 130 excluding the chambers 112 to 114 is a chamber in which a sputtering (deposition) device 200 is arranged.

Figure 2A:
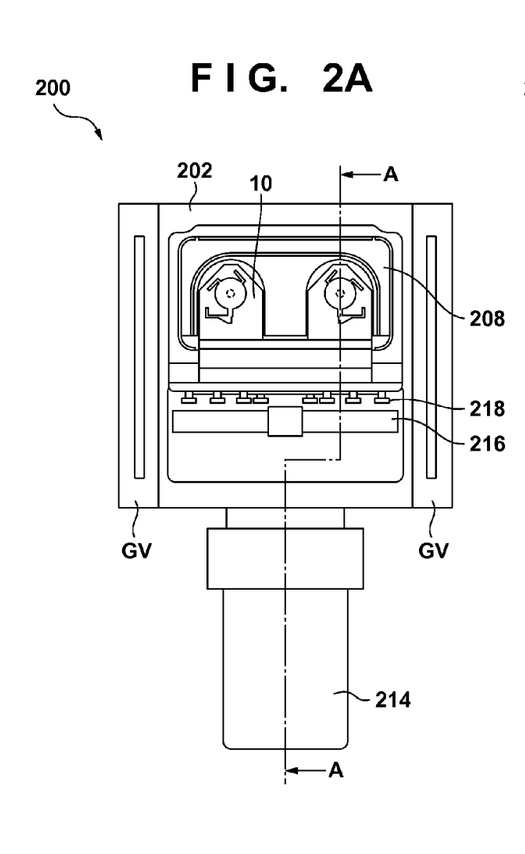
FIGS. 2A and 2B are views showing the arrangement of a sputtering apparatus.
Figure 2B:
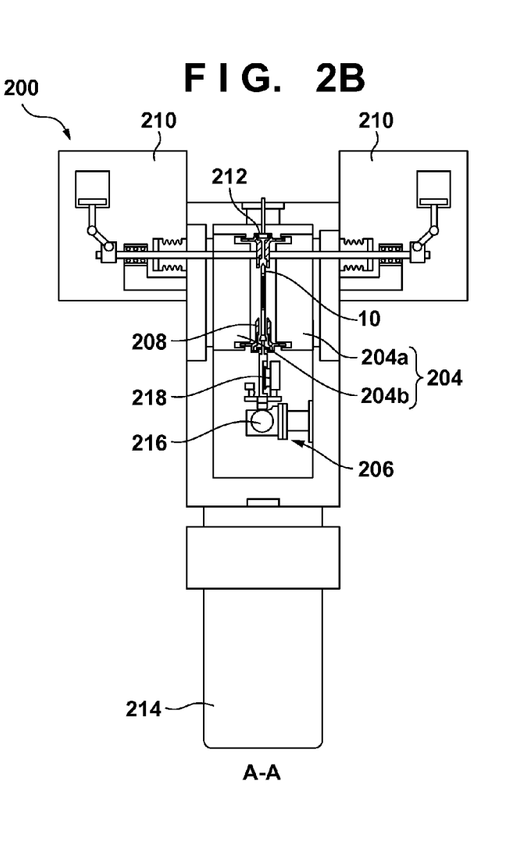

FIGS. 2A and 2B are views showing the arrangement of the sputtering apparatus 200. FIG. 2A is a front view of the sputtering apparatus 200. FIG. 2B is a sectional view of the sputtering apparatus 200 taken along A-A in FIG. 2A. The sputtering apparatus 200 includes, as main constituent elements, a vacuum vessel 202, a cathode 204, a conveying device 206 which conveys the carrier 10, a shield member 208, and moving devices 210 which move the shield member 208.

The vacuum vessel 202 is connected to an adjacent vacuum vessel via a gate valve GV. While the gate valve GV is closed, the vacuum vessel 202 is evacuated by a vacuum pump (a turbo-molecular pump, cryopump, or the like) 214 attached to the vacuum vessel 202. The cathode 204 is arranged in the interior of the vacuum vessel 202 (inside the vacuum vessel) to perform sputtering (deposition) on the substrate 1 conveyed into the vacuum vessel 202. While the gate valve GV is open, the vacuum vessel 202 is coupled to the interior of an adjacent vacuum vessel. This makes it possible to convey (move) the carrier 10 (substrates 1) between the adjacent vacuum vessels via the conveying device 206.

The conveying device 206 is arranged below the carrier 10. The conveying device 206 includes, for example, a cylindrical partition wall (not shown), a magnetic coupling roller including a roller-side magnet 216 provided inside the cylindrical partition wall, and posture maintaining rollers 218. The posture maintaining rollers 218 serve to maintain the constant distance between the carrier 10 and the roller-side magnet 216 and maintain the posture (upright) of the carrier 10. The magnetic coupling roller includes the roller-side magnet 216 which is a round rod-like member and a helically extending elongated magnet. The roller-side magnet 216 is formed by helically arranging magnets having different magnetic poles and is arranged so as to face a carrier-side magnet 310 through the partition wall. The partition wall is made of a material having high magnetic permeability. The roller-side magnet 216 is magnetically coupled to the carrier-side magnet 310 through the partition wall. Note that the space on the carrier side of the partition wall is located on the vacuum side (the interior side of the vacuum vessel 202), and the space on the magnetic coupling roller side is located on the atmospheric side. When the magnetic coupling roller rotates, the roller-side magnet 216 also rotates. A state in which the roller-side magnet 216 rotates can be regarded, when viewed from the carrier-side magnet 310, as a state in which magnets having different magnetic poles are alternatively arrayed in a line and integrally and linearly move along the arraying direction. Therefore, the carrier-side magnet 310 magnetically coupled to the roller-side magnet 216 linearly moves together with the rotation of the roller-side magnet 216. This makes the carrier 10 linearly move.

The cathode 204 is an electrode which holds a target having a larger diameter than the substrate 1 and applies a high voltage to the target. A magnet including a rotating mechanism for improving the usage efficiency of the target is arranged on the reverse surface (on the atmospheric side) of the target. The cathode 204 is a supply source (process source) which supplies a material for a process on the substrate 1, and is a unit for generating a plasma for the formation of a thin film on the substrate 1 in this embodiment. The cathode 204 includes a first cathode (first supply source) 204a and a second cathode (second supply source) 204b which are arranged to respectively face the first surface of each substrate 1, conveyed into the vacuum vessel 202, and the second surface on the opposite side to the first surface. Note that since this embodiment exemplifies the sputtering apparatus 200, the cathode 204 serves as a process source. However, the process source to be used is not limited to this. For example, in the case of a vacuum processing apparatus for dry etching, an ion beam source serves as a process source.

Figure 3A:
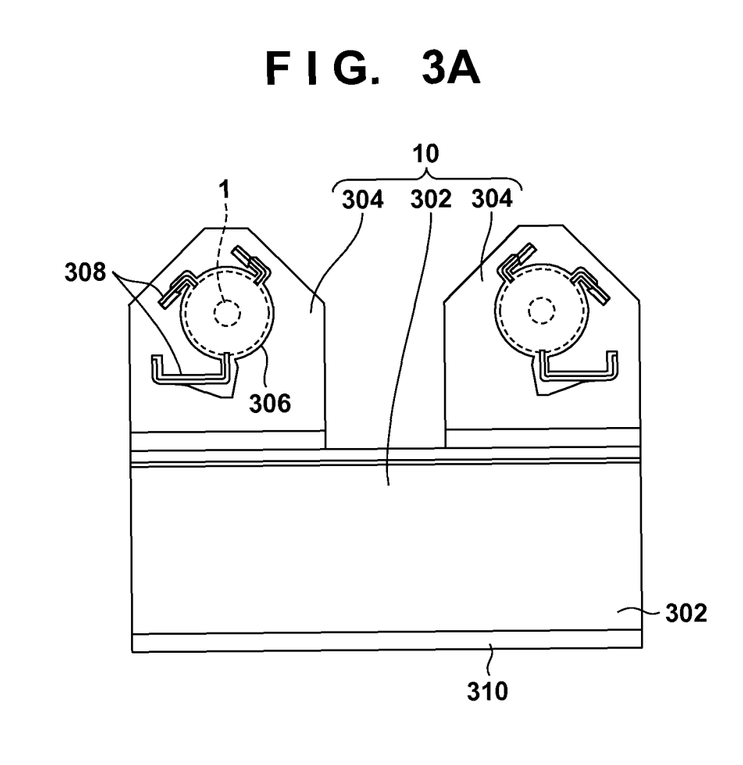
FIGS. 3A and 3B are views showing the arrangement of a carrier.
Figure 3B:
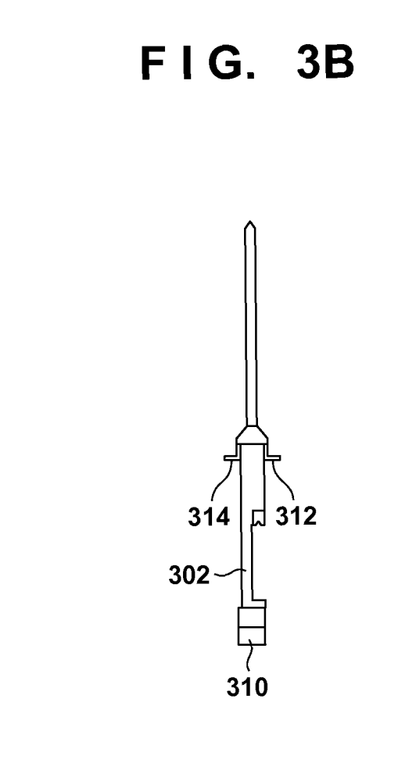

The carrier 10 is a plate-like member as a whole, which is conveyed in a vertical posture by the conveying device 206. FIGS. 3A and 3B show the arrangement of the carrier 10. FIG. 3A is a front view of the carrier 10. FIG. 3B is a side view of the carrier 10 shown in FIG. 3A. The carrier 10 includes a slider 302 and holders 304 provided on the slider 302. In this embodiment, the holders 304 hold two substrates 1. However, the holders 304 may hold one substrate 1 or three or more substrates 1. In addition, each holder 304 holds the substrate 1 so as to expose the two surfaces of the substrate 1, that is, the first and second surfaces of the substrate 1. The carrier 10 is conveyed inside the vacuum vessel 202 by the conveying device 206, and the two substrates 1 are sequentially located in front of the target (cathode 204). Therefore, the substrate 1 located ahead in the conveying direction is located first in front of the target and deposition is performed. Thereafter, the substrate 1 moves forward by a predetermined distance, and the substrate 1 located behind in the conveying direction is located in front of the target and deposition is performed.

A circular opening 306 having a lager diameter than the substrate 1 is formed in each holder 304. In addition, support pawls 308 for supporting the substrate 1 are attached to the edge portion of each opening 306. The distal end of the support pawl 308 located on the lower edge of the opening 306 is located on a vertical line passing through the center of the held substrate 1 and supports the middle of the lower edge of the substrate 1. In addition, the support pawls 308 are formed to come into contact with the side edges of the substrate 1 at positions higher than the center of the substrate 1 so as to hold the substrate 1. Each support pawl 308 is formed from a leaf spring, which can be bent by being contacted by a closing/opening bar provided on a load lock chamber (chamber 111) or unload lock chamber (chamber 116). In a load lock chamber or unload lock chamber, the substrate 1 is attached to or detached from the carrier 10 (each holder 304) while the support pawls 308 are bent.

As described above, in this embodiment, the substrate 1 is conveyed by moving the carrier 10 in a magnetically coupled state. Therefore, the carrier-side magnet 310 which is magnetically coupled to the roller-side magnet 216 is provided below the carrier 10. The carrier-side magnet 310 is constituted by permanent magnets each having magnetic poles in the vertical direction, with different magnetic poles being alternately arranged in the conveying direction of the carrier 10.

Figure 4:
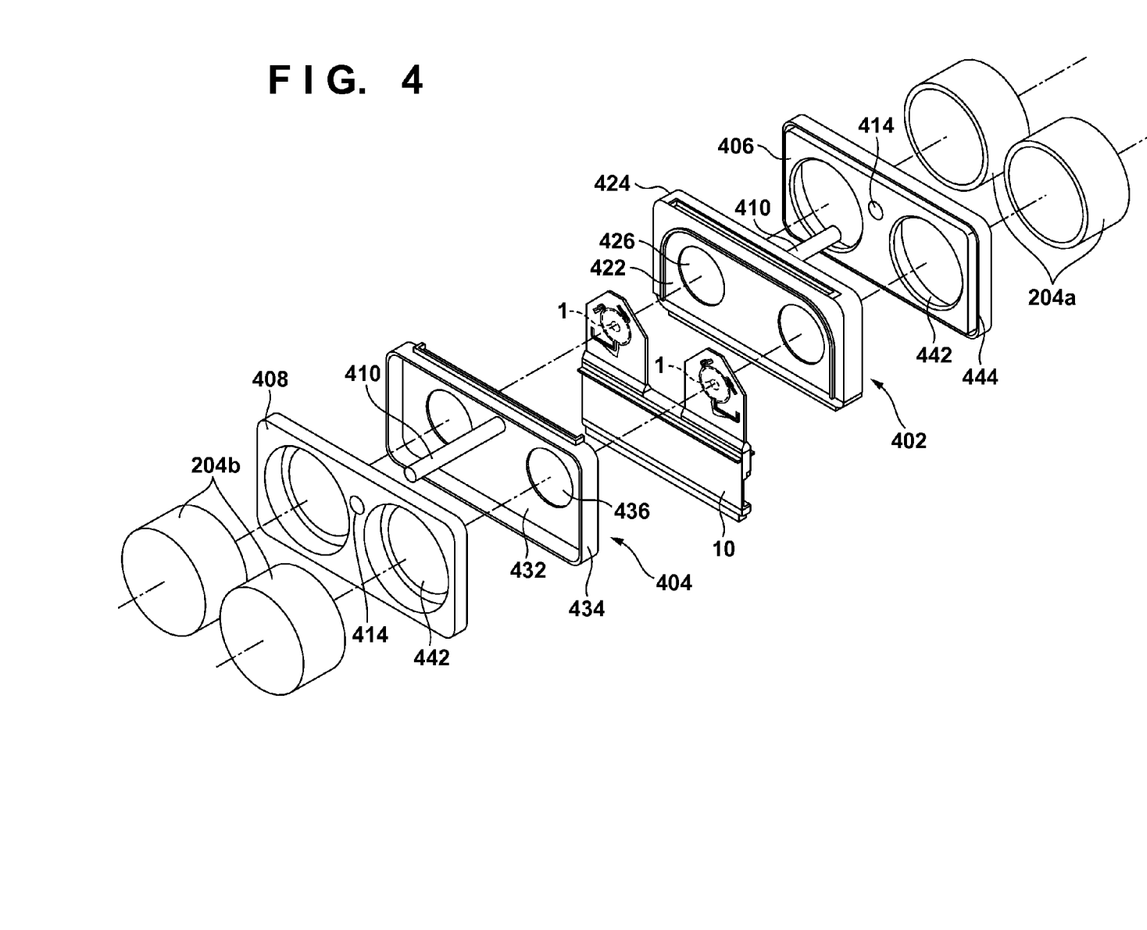
FIG. 4 is a view showing the arrangement of a shield member.

As shown in FIG. 4, the shield member 208 includes a first shield 402 and a second shield 404 (a pair of shields) arranged to sandwich the carrier 10 (substrates 1) conveyed into the vacuum vessel 202 and located at the process position. The first shield 402 is provided around the first cathodes 204a. The second shield 404 is provided around the second cathodes 204b. The first shield 402 and the second shield 404 are configured to be advanced/retreated (moved) to/from the carrier 10 at the process position by the moving devices 210. More specifically, the first shield 402 and the second shield 404 respectively include shaft portions 410 connected to the moving devices 210 and extending to the opposite sides relative to the substrate conveyed into the vacuum vessel 202. As will be described later, the moving devices 210 move the first shield 402 and the second shield 404 so as to set a close state in which the first shield 402 and the second shield 404 are close to each other or a separate state in which the first shield 402 and the second shield 404 are separate from each other.

The shield member 208 includes a first shield base 406 which comes into contact with the first shield 402 and a second shield base 408 which comes into contact with the second shield 404. Assuming that the conveyance position of the carrier 10 is the center and the wall side (chamber wall side) of the vacuum vessel 202 is the outward direction, the first shield base 406 is arranged outside the first shield 402, and the second shield base 408 is arranged outside the second shield 404. Holes 414 are respectively formed in the first shield base 406 and the second shield base 408. The shaft portions 410 respectively provided on the first shield 402 and the second shield 404 extend through the holes 414. The holes 414 restrict the movement of the shaft portions 410 except for the back and forth movement.

The first shield 402 and the second shield 404 are aluminum or stainless plate members which are formed to respectively surround the spaces in front of the first cathode 204a and the second cathode 204b. The first shield 402 includes a rectangular facing portion 422 facing the substrate 1 conveyed into the vacuum vessel 202 and a surrounding portion 424 extending from the outer circumference of the facing portion 422 and surrounding the first cathode 204a. Likewise, the second shield 404 includes a rectangular facing portion 432 facing the substrate 1 conveyed into the vacuum vessel 202 and a surrounding portion 434 extending from the outer circumference of the facing portion 432 and surrounding the second cathode 204b. Openings 426 and 436 are respectively formed in the facing portions 422 and 432 at positions facing the substrates 1 conveyed into the vacuum vessel 202.

The shield member 208 forms process spaces (discharge spaces) when the moving devices 210 move the first shield 402 and the second shield 404 to set the close state (locate them on the substrate side). These process spaces are respectively formed between the first cathodes 204a and the substrates 1 and between the second cathodes 204b and the substrates 1. The two surfaces (first and second surfaces) of each substrate 1 are respectively exposed to the process spaces through the opening 426 of the facing portion 422 of the first shield 402 and the opening 436 of the facing portion 432 of the second shield 404. Therefore, processes are applied to the two surfaces of each substrate 1 in the process spaces. Note that since each process space needs to have a size that makes it possible to properly maintain the distribution of thin films deposited on a substrate, the size of the process space is decided in accordance with the sizes of the target and substrate.

The first shield base 406 and the second shield base 408 are almost rectangular plate members and are fixed to the inner wall side of the vacuum vessel 202. Openings 442 for exposing the targets attached to the first cathodes 204a and the second cathodes 204b to the substrate side are respectively formed in the first shield base 406 and the second shield base 408. The openings 442 formed in the first shield base 406 surround the first cathodes 204a. The openings 442 formed in the second shield base 408 surround the second cathodes 204b. In this embodiment, the two openings 442 are formed in each of the first shield base 406 and the second shield base 408 in accordance with the number of cathodes 204.

A concave portion (a second concave portion corresponding to a second convex portion) 444 for accommodating the end portion (the second convex portion protruding to the first shield base side) of the surrounding portion 424 of the first shield 402 is formed in the outer circumferential portion of the first shield base 406. Inserting the end portion of the surrounding portion 424 into the concave portion 444 will form a nested structure for preventing a process material (sputter material) generated in the process space from leaking from the process space to the outside space. In this manner, the end portion of the surrounding portion 424 of the first shield 402 and the concave portion 444 of the first shield base 406 constitute the nested structure while the first shield 402 is in contact with the first shield base 406.

Likewise, a concave portion (a third concave portion corresponding to a third convex portion) for accommodating the end portion (the third convex portion protruding to the second shield base side) of the surrounding portion 434 of the second shield 404 is formed in the outer circumferential portion of the second shield base 408. Inserting the end portion of the surrounding portion 434 into the concave portion will form a nested structure for preventing a process material generated in the process space from leaking from the process space to the outside space. In this manner, the end portion of the surrounding portion 434 of the second shield 404 and the concave portion of the second shield base 408 constitute the nested structure while the second shield 404 is in contact with the second shield base 408.

In this manner, in this embodiment, the first shield base 406 and the second shield base 408 are provided to prevent (reduce) process materials from adhering to portions around the cathode 204 or prevent (reduce) materials from the cathode 204 from leaking. However, these shield bases are not essential members.

Figure 5:
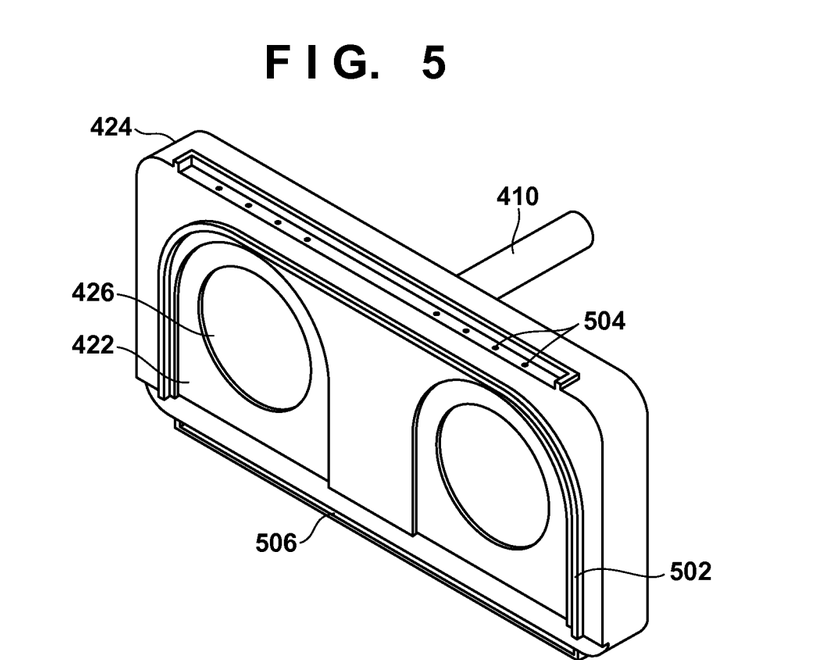
FIG. 5 is a view showing a state in which a first shield is in contact with a first shield base.
Figure 6:
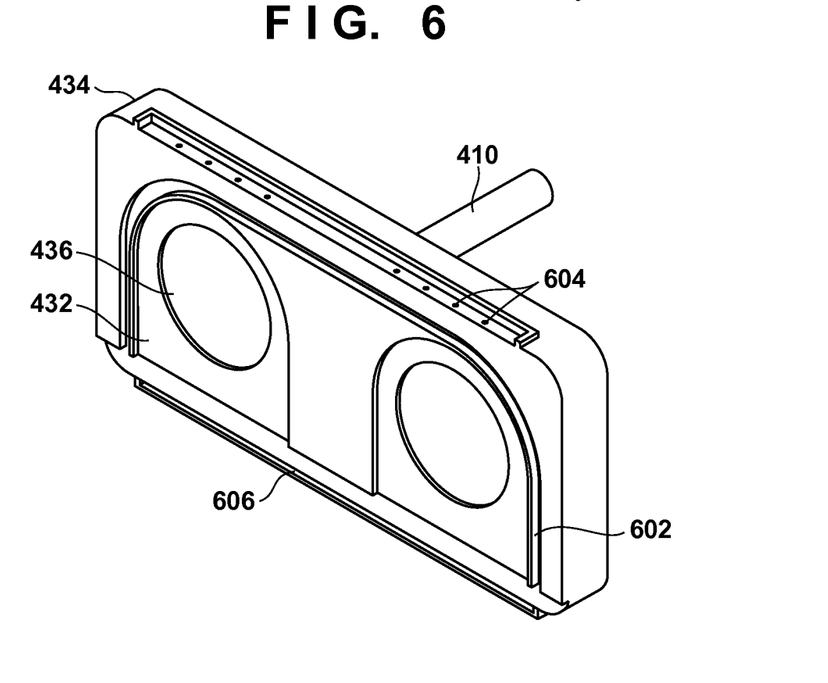
FIG. 6 is a view showing a state in which a second shield is in contact with a second shield base.

FIG. 5 is a view showing a state in which the first shield 402 and the first shield base 406 are in contact with each other. FIG. 6 is a view showing a state in which the second shield 404 and the second shield base 408 are in contact with each other.

As shown in FIG. 5, a convex portion (first convex portion) 502 protruding to the second shield side is formed on the facing portion 422 of the first shield 402 so as to surround the holders 304. A concave portion (fourth concave portion) 506 corresponding to a convex portion (fourth convex portion) 312 provided on the carrier 10 so as to protrude to the first shield side is formed below the facing portion 422 of the first shield 402. In addition, gas inlets 504 are formed in the surrounding portion 424 of the first shield 402. The gas inlets 504 extend through the surrounding portion 424 to make it possible to supply a process gas from the outside of the surrounding portion 424 to the inside of the surrounding portion 424. More specifically, as shown in FIGS. 2A and 2B, a gas shower panel (gas supply unit) 212 which supplies a process gas (discharge gas) into the vacuum vessel 202 is provided at the upper portion of the vacuum vessel 202. The gas shower panel 212 is connected to the gas inlets 504 when the first shield 402 and the second shield 404 are moved to set the close state. Therefore, in this close state, a process gas from the gas shower panel 212 is supplied into the process space via the gas inlets 504.

As shown in FIG. 6, a concave portion (first concave portion) 602 corresponding to the convex portion 502 of the first shield 402 is formed in the facing portion 432 of the second shield 404 so as to surround the holders 304. A concave portion (fifth concave portion) 606 corresponding to a convex portion (fifth convex portion) 314 provided on the carrier 10 so as to protrude to the second shield side is formed below the facing portion 432 of the second shield 404. In addition, gas inlets 604 are formed in the surrounding portion 434 of the second shield 404. The gas inlets 604 extend through the surrounding portion 434 to make it possible to supply a process gas from the outside of the surrounding portion 434 to the inside of the surrounding portion 434. The gas inlets 604 are connected to the gas shower panel 212 when the first shield 402 and the second shield 404 are moved to set the close state. A process gas from the gas shower panel 212 is then supplied into the process space via the gas inlets 604.

When the first shield 402 and the second shield 404 are moved to set the close state, the convex portion 502 of the first shield 402 is inserted into the concave portion 602 of the second shield 404 to form a nested structure. In this manner, in the close state, the convex portion 502 of the first shield 402 and the concave portion 602 of the second shield 404 constitute a nested structure for preventing a process material from leaking from the process space to the outside space.

Likewise, the first shield 402 and the second shield 404 are moved to set the close state, the convex portions 312 and 314 of the carrier 10 are respectively inserted into the concave portion 506 of the first shield 402 and the concave portion 606 of the second shield 404 to form a nested structure. In this manner, in the close state, the concave portion 506 of the first shield 402, the convex portion 312 of the carrier 10, the concave portion 606 of the second shield 404, and the convex portion 314 of the carrier 10 constitute a nested structure for preventing a process material from leaking from the process space to the outside space.

In this embodiment, when the first shield 402 and the second shield 404 are moved to set the close state, process spaces are formed on the two sides of each substrate 1 conveyed into the vacuum vessel 202. Note however that the process materials generated in the process spaces cannot move outside the process spaces unless they pass through either of the nested structures described above. In this case, the nested structure is a structure configured to prevent the inner wall of the vacuum vessel 202 from being seen from each process space. Therefore, a process material cannot move outside each process space unless it collides with either of the inner walls of the process spaces a plurality of times. In this embodiment, therefore, it is possible to effectively prevent the leakage of a process material.

Figure 7:
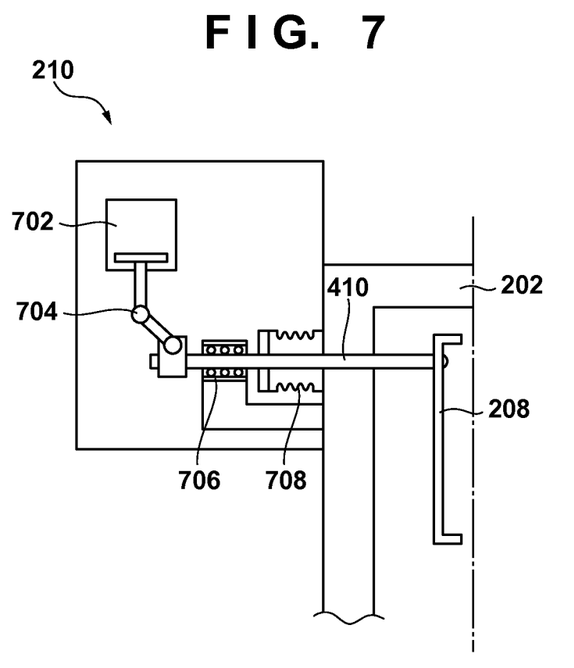
FIG. 7 is a view showing an example of the arrangement of a moving device which moves a shield member.
Figure 8:
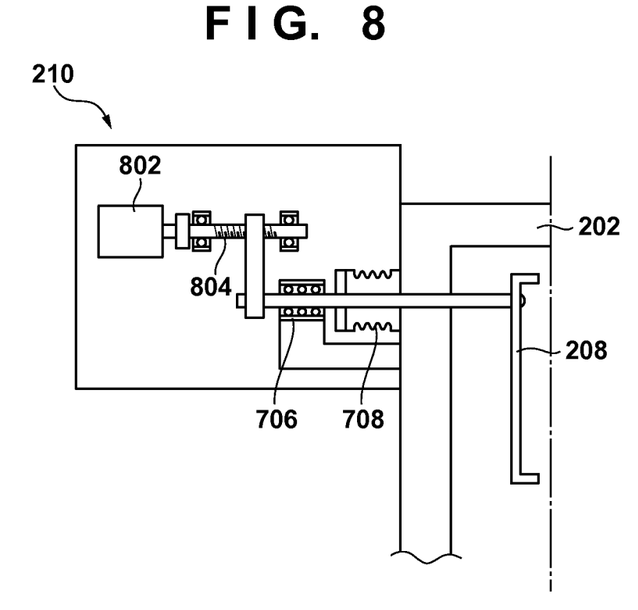
FIG. 8 is a view showing an example of the arrangement of the moving device which moves a shield member.

FIG. 7 is a view showing an example of the arrangement of each moving device 210 which moves the shield member 208 (the first shield 402 and the second shield 404). Each moving device 210 includes an air cylinder 702 which generates power to move each shaft portion 410 forward and backward. The air cylinder 702 is connected to the shaft portion 410 via a link mechanism including a fixed shaft 704 and a guide 706. This makes it possible to control the power transmitted from the air cylinder 702 to the shaft portion 410 (reduce the operating speed), thereby reducing the vibration of the shaft portion 410. It can be expected to reduce particles by reducing vibration. In addition, each moving device 210 includes a bellows 708 arranged around the shaft portion 410. The bellows 708 shuts off the vacuum side from the atmospheric side. Note that each moving device 210 may include a motor 802 instead of the air cylinder, as shown in FIG. 8. The motor 802 which generates power to move the shaft portion 410 forward and backward is connected to the shaft portion 410 via a ball screw 804 and the guide 706.

Figure 9A:
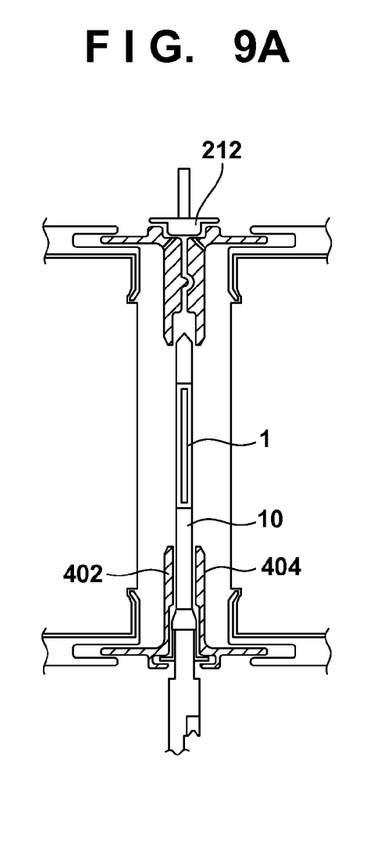
FIGS. 9A to 9C are views for explaining a state in which the first and second shields are close to each other and a state in which they are separate from each other.
Figure 9B:
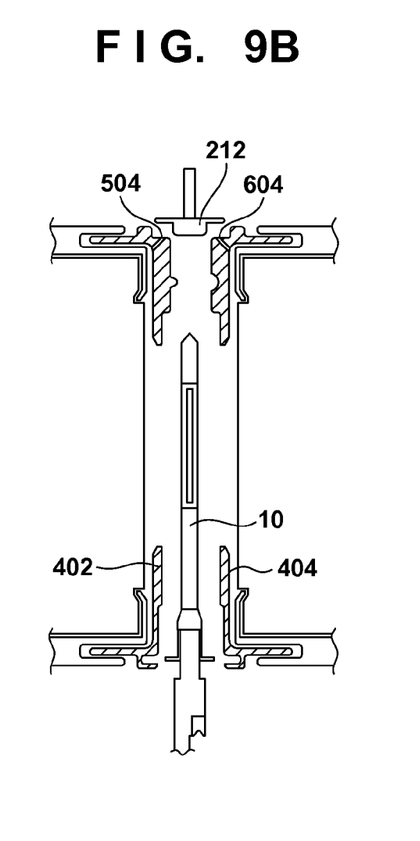
Figure 9C:
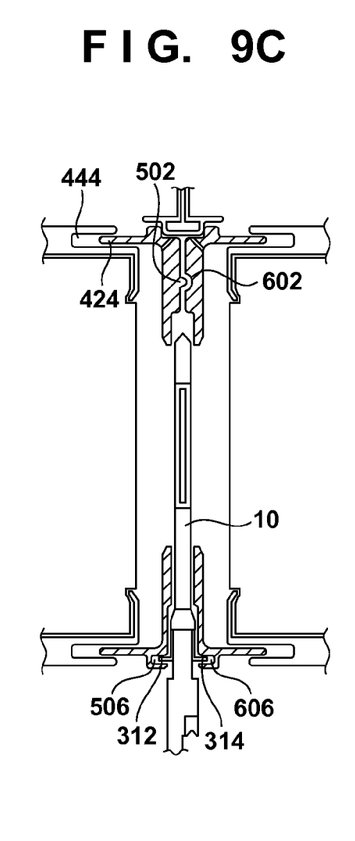

The close state and separate state of the first shield 402 and the second shield 404 will be described with reference to FIGS. 9A to 9C. FIG. 9B shows a state in which the first shield 402 and the second shield 404 are moved to set the separate state in which the first shield 402 and the second shield 404 are separate from each other. When the carrier 10 (substrates 1) is conveyed into the vacuum vessel 202, the carrier 10 cannot be conveyed inside the vacuum vessel 202 and cannot be located at the process position in the close state in which the first shield 402 and the second shield 404 are close to each other. When conveying the carrier 10, therefore, it is necessary to set the first shield 402 and the second shield 404 in the separate state. When the carrier 10 is located at the process position, as shown in FIG. 9A, the moving devices 210 move the first shield 402 and the second shield 404 to the carrier side. FIG. 9A shows a state in which the first shield 402 and the second shield 404 are moved to set the close state in which the first shield 402 and the second shield 404 are close to each other. This makes the first shield 402 and the second shield 404 surround the carrier 10 to form process spaces. At this time, as shown in FIG. 9C, the above nested structure is formed between the first shield 402 and the second shield 404. In addition, the above nested structures are also respectively formed between the first shield 402 and the first shield base 406, between the second shield 404 and the second shield base 408, and between the first shield 402, the second shield 404, and the carrier 10. It is therefore possible to prevent a process material from leaking from the process spaces to the outside space.

When the first shield 402 and the second shield 404 are moved close to each other, a process gas is supplied from the gas shower panel 212 into the process spaces, and a process (deposition) on the substrate 1 is started. In order to prevent a reduction in productivity, a process gas may be supplied while the first shield 402 and the second shield 404 are moved (while setting them in the close state) after the carrier 10 is located at the process position. In this case, before the movement of the first shield 402 and the second shield 404 is complete, a process material may partially leak from each process space to the outside. It is therefore preferable to arrange shields at portions where a process material leaks during the movement of the first shield 402 and the second shield 404.

Figure 10A:
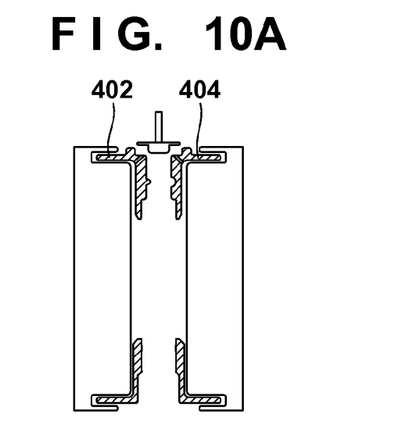
FIGS. 10A to 10E are views for explaining the operation of the sputtering apparatus.
Figure 10B:
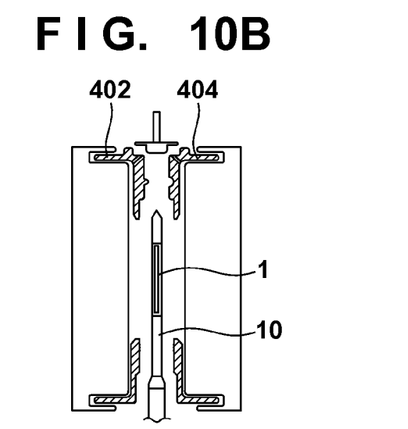
Figure 10C:
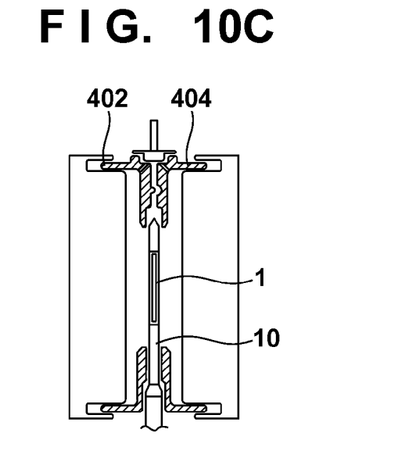
Figure 10D:
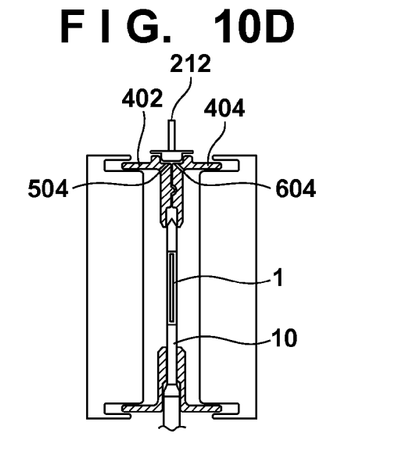
Figure 10E:
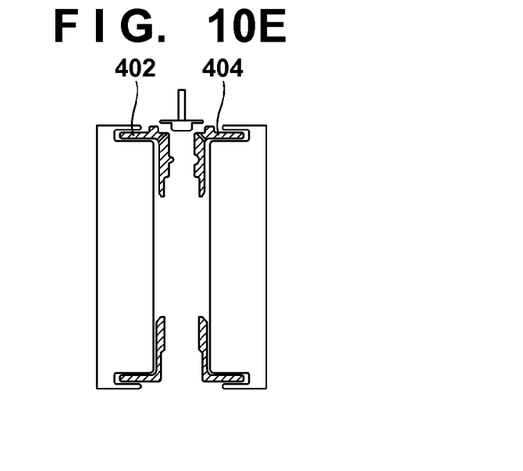

The operation of the sputtering apparatus 200 will be described with reference to FIGS. 10A to 10E. First of all, before the carrier 10 is conveyed into the vacuum vessel 202, the moving devices 210 move the first shield 402 and the second shield 404 so as to set the separate state, as shown in FIG. 10A. As shown in FIG. 10B, the conveying device 206 then conveys the carrier 10 (the substrates 1) into the vacuum vessel 202 and locates the carrier 10 at the process position, while the separate state in which the first shield 402 and the second shield 404 are separate from each other is maintained. As shown in FIG. 10C, the moving devices 210 then moves the first shield 402 and the second shield 404 so as to set the close state in which the first shield 402 and the second shield 404 are close to each other, thereby forming process spaces. As shown in FIG. 10D, a process gas is supplied from the gas shower panel 212 into the process spaces via the gas inlets 504 and 604 to form plasmas in the process spaces, thereby performing sputtering (deposition) on the two surface of the substrate 1. As shown in FIG. 10E, the moving devices 210 then move the first shield 402 and the second shield 404 so as to set the separate state in which the first shield 402 and the second shield 404 are separate from each other. The conveying device 206 conveys the carrier 10 (the substrate 1 on which sputtering has been performed) from the vacuum vessel 202. The sputtering apparatus 200 repeats this operation (FIGS. 10A to 10E) to sequentially perform deposition on the substrates 1 conveyed into the vacuum vessel 202.

In this embodiment, the two shields (the first shield 402 and the second shield 404) are set in the close state to form process spaces surrounding each substrate conveyed into the vacuum vessel, and prevent thin films from adhering to the inner wall surface of the vacuum vessel and units and the like inside the vacuum vessel. As described above, the embodiment can form process spaces by using a smaller number of shields (two shields) than in the related art. This facilitates maintenance and suppress a maintenance cost even if shields are periodically replaced. This is because a smaller number of shields can greatly shorten the replacement time. In addition, in the embodiment, it is possible to form process spaces after a carrier is conveyed, because shields are movable. This makes it possible to arrange shields in the vacuum vessel without any consideration of the structure of the vacuum vessel and the convey paths of a carrier. Furthermore, the embodiment can minimize the spaces other than the process spaces and reduce the volume of the interior of the vacuum vessel (the volume to be evacuated). This facilitates maintaining a stable pressure distribution in the vacuum vessel.

In this embodiment, each shield includes a facing portion and a surrounding portion. Even if each shield includes only a surrounding portion, the effects of the present invention can be obtained to some extent. In addition, the present invention is not limited to the sputtering apparatus, and can be applied to any processing apparatus which needs to arrange shields in a vacuum vessel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-027821 filed on Feb. 17, 2014, which is hereby incorporated by reference herein in its entirety.

What is claimed is:

1. A processing apparatus comprising:
a vacuum vessel;
a supply source including a first supply source and a second supply source arranged to respectively face a first surface of a substrate conveyed into the vacuum vessel and a second surface on an opposite side to the first surface and configured to supply a material to apply a process to the substrate;
a shield member including a first shield provided around the first supply source and a second shield provided around the second supply source, the first shield and the second shield being arranged to sandwich the substrate; and
a moving device configured to move the first shield and the second shield to set one of a first state in which the first shield and the second shield are arranged with respect to each other so as to form process spaces between the first shield and the second shield, and a second state in which the first shield and the second shield are further apart from each other than when in the first state,
wherein the shield member forms the process spaces between the first supply source and the substrate and between the second supply source and the substrate when the moving device moves the first shield and second shield to set the first state, and
the process is applied to the first surface and the second surface in the process spaces,
the processing apparatus further comprising a gas supply unit configured to supply a process gas into the vacuum vessel,
wherein the shield member includes gas inlets which are connected to the gas supply unit in the first state, and
when the moving device moves the first shield and the second shield to set the first state, the process gas is supplied from the gas supply unit into the process spaces via the gas inlets.

2. The apparatus according to claim 1, wherein each of the first shield and the second shield includes a facing portion which faces the substrate conveyed into the vacuum vessel and a surrounding portion which extends from an outer circumference of the facing portion and surrounds the supply source, and
the facing portion has an opening at a position facing the substrate conveyed into the vacuum vessel.

3. A processing apparatus comprising:
a vacuum vessel;
a supply source including a first supply source and a second supply source arranged to respectively face a first surface of a substrate conveyed into the vacuum vessel and a second surface on an opposite side to the first surface and configured to supply a material to apply a process to the substrate;
a shield member including a first shield provided around the first supply source and a second shield provided around the second supply source, the first shield and the second shield being arranged to sandwich the substrate; and
a moving device configured to move the first shield and the second shield to set one of a first state in which the first shield and the second shield are arranged with respect to each other so as to form process spaces between the first shield and the second shield, and a second state in which the first shield and the second shield are further apart from each other than when in the first state,
wherein the shield member forms the process spaces between the first supply source and the substrate and between the second supply source and the substrate when the moving device moves the first shield and second shield to set the first state, and
the process is applied to the first surface and the second surface in the process spaces,
wherein the first shield includes a first convex portion protruding toward the second shield,
the second shield includes a first concave portion corresponding to the first convex portion, and
when the moving device moves the first shield and the second shield to set the first state, the first convex portion and the first concave portion constitute a nested structure for preventing the material generated in the process spaces from leaking from the process spaces to an outside space.

4. The apparatus according to claim 1, wherein the shield member includes a first shield base which comes into contact with the first shield and a second shield base which comes into contact with the second shield,
the first shield includes a second convex portion protruding toward the first shield base,
the first shield base includes a second concave portion corresponding to the second convex portion,
the second shield includes a third convex portion protruding toward the second shield base,
the second shield base includes a third concave portion corresponding to the third convex portion,
the second convex portion and the second concave portion constitute a nested structure for reducing the material generated in the process spaces which leaks from the process spaces to an outside space, while the first shield is in contact with the first shield base, and
the third convex portion and the third concave portion constitute a nested structure for preventing the material generated in the process spaces from leaking from the process spaces to an outside space, while the second shield is in contact with the second shield base.

5. The apparatus according to claim 4, wherein the first shield base has an opening surrounding the first supply source, and
the second shield base has an opening surrounding the second supply source.

6. The apparatus according to claim 1, further comprising a holder configured to hold the substrate so as to expose the first surface and the second surface,
the holder includes a fourth convex portion protruding toward the first shield and a fifth convex portion protruding toward the second shield, the first shield includes a fourth concave portion corresponding to the fourth convex portion, the second shield includes a fifth concave portion corresponding to the fifth convex portion, the fourth convex portion and the fourth concave portion constitute a nested structure for preventing the material generated in the process spaces from leaking from the process spaces to an outside space, while the moving device moves the first shield and the second shield to set the first state, and the fifth convex portion and the fifth concave portion constitute a nested structure for preventing the material generated in the process spaces from leaking from the process spaces to an outside space, while the moving device moves the first shield and the second shield to set the first state.

7. The apparatus according to claim 1, wherein the supply source is fixed in the vacuum vessel, and the moving device moves the first shield and the second shield to set the first state when the process is applied to the substrate, and moves the first shield and second shield to set the second state at a time other than when the process is applied to the substrate.

8. A processing apparatus comprising:

a vacuum vessel;

a supply source including a first supply source and a second supply source arranged to respectively face a first surface of a substrate conveyed into the vacuum vessel and a second surface on an opposite side to the first surface and configured to supply a material to apply a process to the substrate;

a shield member including a first shield provided around the first supply source and a second shield provided around the second supply source, the first shield and the second shield being arranged to sandwich the substrate; and a moving device configured to move the first shield and the second shield to set one of a first state in which the first shield and the second shield are arranged with respect to each other so as to form process spaces between the first shield and the second shield, and a second state in which the first shield and the second shield are further apart from each other than when in the first state, wherein the shield member forms the process spaces between the first supply source and the substrate and between the second supply source and the substrate when the moving device moves the first shield and second shield to set the first state, and the process is applied to the first surface and the second surface in the process spaces, wherein each of the first shield and the second shield includes a shaft portion extending to an opposite side to a substrate conveyed into the vacuum vessel, and the moving device moves the first shield and the second shield via the shaft portion.

9. The apparatus according to claim 8, wherein the moving device includes one of an air cylinder and a motor which generates power to move the shaft portion forward and backward.

10. The apparatus according to claim 1, wherein in the first state, the first shield and the second shield are sufficiently close to each other so as to form process spaces between the first shield and the second shield.

11. The apparatus according to claim 3, wherein in the first state, the first shield and the second shield are sufficiently close to each other so as to form process spaces between the first shield and the second shield.

12. The apparatus according to claim 8, wherein in the first state, the first shield and the second shield are sufficiently close to each other so as to form process spaces between the first shield and the second shield.

* * * * *